(12) United States Patent
Chen et al.

(10) Patent No.: US 6,194,328 B1
(45) Date of Patent: Feb. 27, 2001

(54) $H_2$ DIFFUSION BARRIER FORMATION BY NITROGEN INCORPORATION IN OXIDE LAYER

(75) Inventors: Robert C. Chen, Los Altos; Jeffrey A. Shields, Sunnyvale, both of CA (US); Robert Dawson, Austin, TX (US); Khanh Tran, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/207,676

(22) Filed: Dec. 9, 1998

(51) Int. Cl.$^7$ ..................................................... H01L 21/31
(52) U.S. Cl. .................... 438/775; 438/770; 438/789; 438/790; 438/788; 438/766; 427/123; 427/240; 427/249; 427/252; 427/255.7; 427/346
(58) Field of Search ..................................... 438/624, 702, 438/705, 789, 762, 766, 761, 763, 775, 788; 427/123, 240, 249, 255.2, 255.7, 346, 380

(56) References Cited

U.S. PATENT DOCUMENTS

| 4,849,296 | * | 7/1989 | Haluska et al. | 428/457 |
| 5,548,159 | * | 8/1996 | Jeng | 257/634 |
| 5,663,092 | * | 9/1997 | Lee | 438/253 |
| 5,888,911 | * | 3/1999 | Ngo et al. | 438/788 |
| 5,930,634 | * | 7/1999 | Hause et al. | 438/307 |
| 5,936,307 | * | 8/1999 | Schonauer et al. | 257/764 |

* cited by examiner

*Primary Examiner*—David Nelms
*Assistant Examiner*—Reneé R Berry

(57) ABSTRACT

A dielectric interlayer is formed over a semiconductor substrate comprising at least one active region. The exposed upper surface of the dielectric interlayer is treated with nitrogen to form a nitrided barrier layer thereon. At least one hydrogen-containing dielectric layer is formed over the dielectric interlayer having the nitrided barrier layer thereon. The nitrided barrier layer serves as a barrier to diffusion of hydrogen from the at least one hydrogen-containing dielectric layer into the dielectric interlayer, thereby preventing a decrease in hot carrier injection reliability.

12 Claims, 1 Drawing Sheet

H₂ DIFFUSION BARRIER FORMATION BY NITROGEN INCORPORATION IN OXIDE LAYER

TECHNICAL FIELD

The present invention relates to a method of manufacturing a multi-metal layer semiconductor device with improved hot carrier injection reliability. The invention has particular applicability in manufacturing high density multi-metal layer semiconductor devices with design features of 0.25 micron and under.

BACKGROUND ART

The escalating demands for high densification and performance associated with ultra large scale integration semiconductor devices require design features of 0.25 micron and under, such as 0.18 micron, increased transistor and circuit speeds, high reliability and increased manufacturing throughput. The reduction of design features to 0.25 micron and under generates numerous problems challenging the limitations of conventional technology, including conventional photolithographic, etching, and deposition techniques.

Conventional methodology for forming patterned metal layers, as part of "back-end" wafer processing, comprises a subtractive etching or etch back step as the primary metal patterning technique. Such methodology involves the formation of a first dielectric interlayer on a semiconductor substrate, typically doped monocrystalline silicon, with conductive contacts formed therein for electrical connection with an active region in or on the semiconductor substrate, such as a gate oxide or a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric material, such as spin-on glass (SOG) is typically deposited to fill in the gaps between the metal features and baked at an elevated temperature. The baking time is determined depending upon the particular material employed. Thereafter, another dielectric layer is deposited thereover, such as a silicon oxide derived from tetraethyl orthosilicate (TEOS) by plasma enhanced chemical vapor deposition (PECVD). Planarization, as by chemical-mechanical planarization (CMP), is then performed.

The drive to increased density and attendant shrinkage in feature size generates numerous problems. For example, as feature sizes, e.g., metal lines and interwiring spacings, shrink to 0.50 micron and below, such as 0.375 micron, it becomes increasingly difficult to satisfactorily voidlessly fill in the interwiring spacings with a dielectric material and obtain adequate step coverage.

Hydrogen silsesquioxane (HSQ) offers many advantages for use in back-end wafer processing. HSQ is relatively carbon free, thereby rendering it unnecessary to etch back HSQ below the upper surface of the metal lines to avoid poisoned via problems. In addition, HSQ exhibits excellent planarity and is capable of gap filling interwiring spacings less than 0.30 micron while still employing conventional spin-on equipment. HSQ undergoes a melting phase at approximately 200° C., but it does not convert to the high dielectric constant glass phase until reaching temperatures of about 400° C. in intermetal applications. As deposited, HSQ is considered a relatively low dielectric constant ("low k") material with a dielectric constant of about 2.9–3.0, compared to silicon dioxide grown by a thermal oxidation or chemical vapor deposition which has a dielectric constant of about 3.9–4.2. The mentioned dielectric constants are based on a scale wherein 1.0 represents the dielectric constant of air.

Other hydrogen containing low dielectric constant materials suitable for use as gap filling and/or cap layers in back-end wafer processing include but are not limited to methyl silsesquioxane (MSQ) and other organic low k materials.

However, in attempting to apply a hydrogen-containing low k material, such as HSQ, to "back-end" wafer processing as described above, particularly for gap filling, it was found that the hydrogen contained therein undesirably diffuses into the underlying dielectric interlayer during its deposition and/or during subsequent processing. Such hydrogen diffusion into the dielectric interlayer overlying active device regions formed in or on the substrate adversely affects hot carrier injection reliability which, in turn, reduces or deleteriously affects device performance.

In addition, deleterious hydrogen diffusion into the dielectric interlayer may also result upon formation and/or subsequent processing of a hydrogen containing oxide "cap" layer typically deposited over the dielectric layer prior to metal pattern formation and gap filling.

There exists a need for semiconductor technology enabling the use of low dielectric constant gap fill layers, such as HSQ, without adverse impact on hot carrier injection reliability.

DISCLOSURE OF THE INVENTION

An advantage of the present invention is a method of manufacturing a high density, multi-metal layer semiconductor device with improved hot carrier injection reliability.

Another advantage of the present invention is an improved method for "back-end" processing of a semiconductor wafer comprising active device regions therein.

Still another advantage of the present invention is a method for reducing or preventing diffusion of hydrogen into a dielectric interlayer as a result of subsequent formation of hydrogen-containing dielectric layer(s) thereon.

A still further advantage of the present invention is a semiconductor comprising a low k gap fill layer with high hot carrier injection reliability.

Additional aspects, advantages and other features of the present invention will be set forth in part in the description which follows and, in part, will become apparent to those having ordinary skill in the art upon examination of the following or may be learned from the practice of the invention. The aspects and advantages of the invention may be realized and obtained as particularly pointed out in the appended claims.

According to the present invention, the foregoing and other aspects and advantages are achieved, in part, by a method of manufacturing a multilevel semiconductor device, which method comprises: forming a dielectric interlayer on a substrate; treating the exposed upper surface of the dielectric interlayer with nitrogen to form a nitrided barrier layer thereon; and forming at least one hydrogen-containing dielectric layer over the nitrided barrier layer, wherein the nitrided barrier layer prevents diffusion of hydrogen from the at least one hydrogen-containing dielectric layer into the dielectric interlayer.

A further aspect of the present invention is a method of manufacturing a multilevel semiconductor device which comprises: forming a dielectric oxide interlayer on a substrate comprising a semiconductor; treating the exposed upper surface of the dielectric oxide interlayer with nitrogen to form a nitrided barrier layer thereon; forming an oxide cap layer on the nitrided barrier layer; forming a patterned metal layer on the oxide cap layer, the patterned metal layer having metal features spaced apart by gaps; and depositing a layer of low dielectric constant material on the patterned metal layer filling the gaps, wherein at least one of the oxide cap layer and the low dielectric constant material layer contains hydrogen, and the nitrided barrier layer formed on the dielectric oxide interlayer prevents diffusion of hydrogen from the at least one hydrogen containing layer into the dielectric oxide interlayer.

In another aspect of the present invention, the dielectric oxide interlayer comprises silicon oxide, the exposed surface of the dielectric oxide interlayer is treated to form a nitrided barrier layer by implanting nitrogen ions thereinto, the oxide cap layer comprises a silicon oxide derived from silane ($SiH_4$) or tetraethyl orthosilicate (TEOS) under plasma conditions, and the layer of low dielectric constant material comprises hydrogen silsesquioxane (HSQ).

Another aspect of the present invention is an improved semiconductor device comprising: a semiconductor substrate having at least one active device region on or within said substrate; a dielectric oxide interlayer formed on the substrate over the at least one active device region; a patterned metal layer on the oxide cap layer, the patterned metal layer having metal features spaced apart by gaps; a layer of low dielectric constant material on the patterned metal layer and filling the gaps therein, wherein at least one of the oxide cap layer and the low dielectric constant material layer contains hydrogen; and a nitrided barrier layer formed on the surface of the dielectric oxide interlayer at the interface with the oxide cap layer which prevents diffusion of hydrogen from the at least one layer containing hydrogen into the dielectric oxide interlayer.

In a further aspect of the present invention, the semiconductor substrate comprises silicon, the dielectric oxide interlayer comprises a silicon oxide, the oxide cap layer comprises a silicon oxide derived from silane ($SiH_4$) or tetraethyl orthosilicate (TEOS) under plasma conditions, and the layer of low dielectric constant material comprises hydrogen silsesquioxane (HSQ).

Additional aspects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

DESCRIPTION OF THE INVENTION

Figure 1:
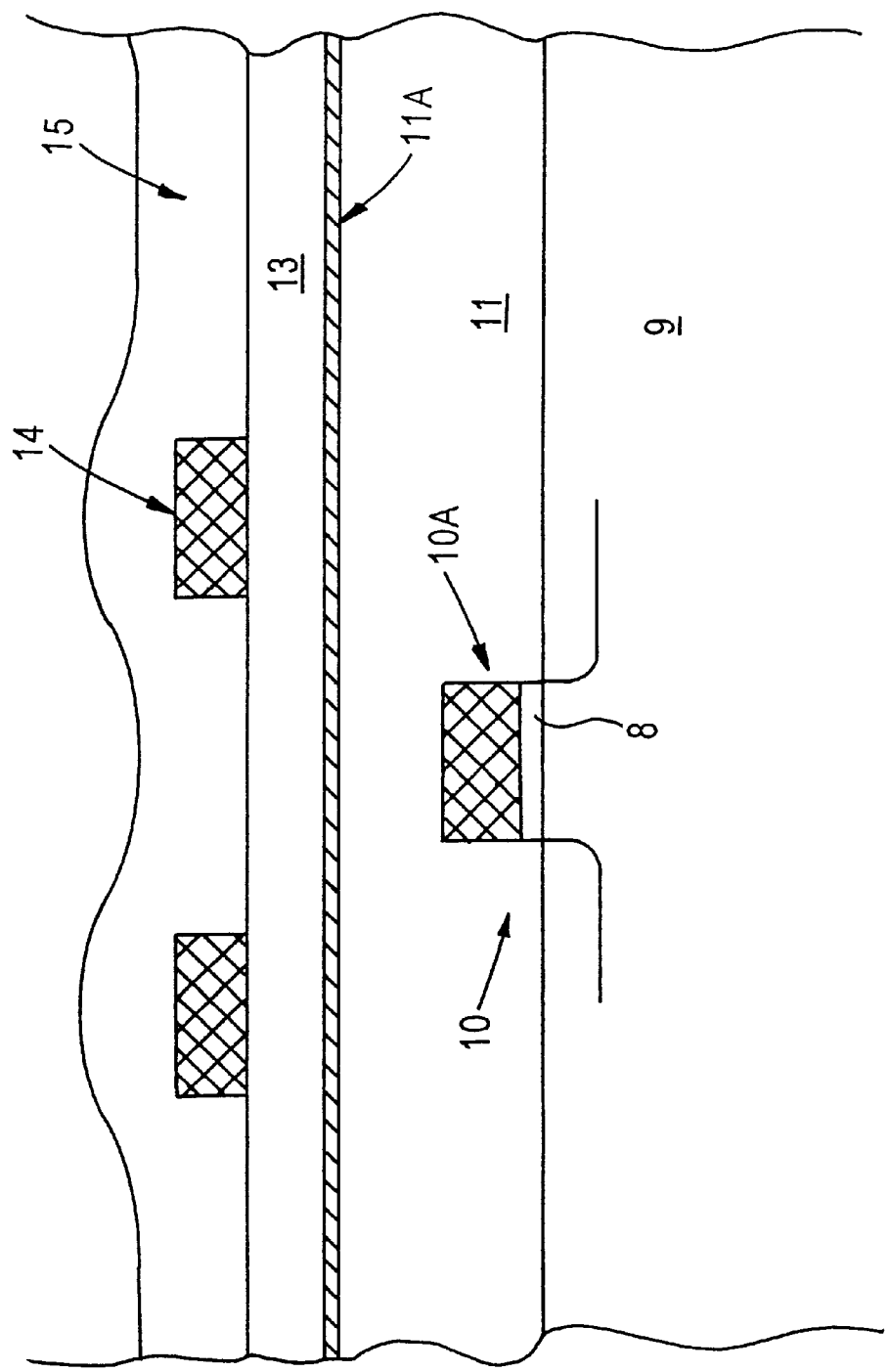
FIG. 1 schematically illustrates in cross-sectional view a semiconductor device having a nitrided hydrogen diffusion barrier layer in accordance with the present invention.

An embodiment of the present invention is schematically illustrated in FIG. 1 and comprises active device region 10 including gate electrode 10A formed on semiconductor substrate 9 with gate oxide layer 8 therebetween. A dielectric interlayer 11, typically a silicon oxide, is formed on substrate 9 covering active device region 10. According to the inventive method, the exposed upper surface of the dielectric interlayer 11 is then treated with nitrogen under conditions sufficient to form a nitrided barrier layer 11A thereon. Nitrided barrier layer 11A is formed to a thickness sufficient to prevent diffusion of hydrogen into dielectric interlayer 11A from at least one hydrogen containing layer formed thereover in subsequent processing. Such subsequent processing can include formation of oxide cap layer 13 and patterned metal layer 14. Gap fill layer 15, comprising a low k material, is then deposited on the oxide cap layer 13, filling the gaps in patterned metal layer 14.

Suitable materials for the dielectric interlayer 11 include silicon oxide derived drom TEOS or silane, formed to a thickness of about 4,000 Å to about 10,000 Å.

The nitrided barrier layer 11A of dielectric interlayer 11 is formed to a thickness sufficient to effectively function as a barrier preventing hydrogen diffusion therethrough and into the underlying dielectric interlayer during and after deposition of the oxide cap layer 13 and/or the low k gap fill layer 15. Given the present disclosure, the thickness of nitrided barrier layer 11A can be readily optimized in a particular situation. For example, a nitrided barrier layer thickness of from about 50 Å to about 300 Å is considered sufficient to substantially prevent diffusion from an overlying HSQ gap fill layer.

Formation of the nitrided barrier layer can be effected in several ways. For example, embodiments of the present invention include treating the exposed upper surface of the dielectric interlayer 11 with nitrogen under conditions and for a period of time sufficient to form nitrided barrier layer 12A to a thickness sufficient to serve as a barrier preventing diffusion of hydrogen therethrough. Such treatment methods include nitrogen ion implantation or exposure to a plasma containing nitrogen atoms or ions.

When forming the nitrided barrier layer by ion implantation, the implantation energy and implantation dosage are controlled to achieve a desired thickness. For example, a nitrided barrier layer having a thickness of about 100 Å to about 500 Å can be formed at an implantation energy of about 1 KeV to about 10 KeV and an implantation dosage sufficient to provide about 5% to about 20% nitrogen by volume.

The conditions for plasma treatment can also be controlled to form an optimum nitride barrier layer thickness. For example, a nitrided barrier laying having a thickness of about 50 Å to about 100 Å can be formed by treating the upper surface of the dielectric interlayer with an RF plasma containing nitrogen at a pressure of about 5 mTorr to about 50 mTorr at an RF power of about 500 W to about 1500 W.

Oxide cap layer 13 can be formed to a thickness of about 1,000 Å to about 10,000 Å and may comprise a silicon oxide layer, such as a silicon oxide layer derived from silane ($SiH_4$) in an $N_2O$ atmosphere by plasma enhanced chemical vapor deposition (PECVD) or from tetraethyl orthosilicate (TEOS) in the presence of oxygen by PECVD, both under known conditions.

Patterned metal layer 14 can be formed by depositing a layer of, e.g., aluminum or aluminum alloy, over oxide cap layer 13 employing a conventional deposition technique, e.g., sputtering or chemical vapor deposition, and then patterning the deposited metal layer. Patterning can be implemented by forming a photoresist mask thereover having a pattern corresponding to a desired conductive pattern and etching to form the conductive pattern comprising metal features separated by gaps.

Advantageously, HSQ can be employed to gap fill patterned metal layer 14. Other available low k materials include MSQ.

Thus, the present invention enables the use of hydrogen containing low k materials, such as HSQ, for gap filling patterned metal layers, while preventing undesirable diffusion of hydrogen into an underlying dielectric interlayer, thereby maintaining hot carrier injection reliability.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well-known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises the sequential steps of:

forming a dielectric interlayer on a substrate;

treating the exposed upper surface of said dielectric interlayer with nitrogen to form a nitrided barrier layer thereon; and forming at least one hydrogen containing dielectric layer over said nitrided barrier layer, wherein said nitrided barrier layer prevents diffusion of hydrogen from said at least one hydrogen containing dielectric layer into said dielectric interlayer.

2. The method according to claim 1, wherein said dielectric interlayer comprises a silicon oxide layer derived from tetraethyl orthosilicate or silane and having a thickness of from about 4,000 Å to about 10,000 Å.

3. The method according to claim 1, wherein the nitrided barrier layer has a thickness of from about 50 Å to about 300 Å.

4. The method according to claim 1, wherein said treating with nitrogen comprises implanting nitrogen ions into said exposed upper surface of said dielectric interlayer to form a nitrided barrier layer having a thickness of from about 100 Å to about 500 Å, and said implanting comprises implanting nitrogen ions at an implantation energy of from about 1 KeV to about 10 KeV and at a dosage sufficient to provide from about 5% to about 20% nitrogen by volume.

5. The method according to claim 1, wherein said treating with nitrogen comprises exposing the upper surface of said dielectric interlayer to a plasma containing nitrogen to form a nitrided barrier layer having a thickness of from about 50 angstroms to about 100 angstroms, and said plasma treating comprises exposing the upper surface of said dielectric interlayer to a plasma containing nitrogen at a pressure of about 5 mTorr to about 50 mTorr at an RF power of from about 500 W to about 1,500 W.

6. The method according to claim 1, further comprising:

forming an oxide cap layer on said nitrided surface layer;

forming a patterned metal layer on said oxide cap layer, said patterned metal layer having metal features spaced apart by gaps; and depositing a layer of low dielectric constant material on said patterned metal layer filling the gaps.

7. The method according to claim 6, comprising depositing a silicon oxide cap layer under plasma conditions, wherein said silicon oxide is derived from silane ($SiH_4$) in an $N_2O$ atmosphere or from tetraethyl orthosilicate (TEOS) in the presence of oxygen by plasma enhanced chemical vapor deposition (PECVD).

8. The method according to claim 6, wherein said layer of low dielectric constant material comprises hydrogen silsesquioxane (HSQ) or methyl silsesquioxane (MSQ).

9. The method according to claim 1, wherein the substrate comprises a semiconductor substrate.

10. The method according to claim 9, further comprising forming at least one active device region on or within said semiconductor substrate.

11. A method of manufacturing a semiconductor device, which method comprises the sequential steps of:

forming a dielectric oxide interlayer on a substrate comprising a semiconductor;

treating the exposed upper surface of said dielectric oxide interlayer with nitrogen to form a nitrided barrier layer thereon;

forming an oxide cap layer on said nitrided surface layer;

forming a patterned metal layer on said oxide cap layer, said patterned metal layer having metal features spaced apart by gaps; and depositing a layer of low dielectric constant material on said patterned metal layer filling the gaps, wherein at least one of said oxide cap layer and said low dielectric constant material layer contains hydrogen, and the nitrided surface layer formed on the dielectric oxide interlayer prevents diffusion of hydrogen from the at least one layer containing hydrogen into said dielectric oxide interlayer.

12. The method according to claim 11, wherein:

said dielectric oxide interlayer comprises silicon oxide;

said treating of the exposed surface of the dielectric oxide interlayer to form a nitrided surface layer comprises implanting nitrogen ions into the exposed upper surface thereof;

said oxide cap layer comprises a silicon oxide derived from silane ($SiH_4$) or tetraethyl orthosilicate (TEOS) under plasma conditions; and said layer of low dielectric constant material comprises hydrogen silsesquioxane (HSQ).

* * * * *